United States Patent [19]

St. Clair

[11] Patent Number: 5,046,874

[45] Date of Patent: Sep. 10, 1991

[54] IMPACT PRINTER PRINT HEAD WITH ACTIVE SOUND PRESSURE ATTENUATION MEANS

[76] Inventor: James S. St. Clair, 765 Westwood Dr., Apt. 4B, Clayton, Mo. 63105

[21] Appl. No.: 492,820

[22] Filed: Mar. 13, 1990

[51] Int. Cl.[5] ........................ B41J 29/08; H03B 29/00

[52] U.S. Cl. ........................................ 400/689; 381/71

[58] Field of Search ........................... 101/689; 381/71

[56] References Cited

U.S. PATENT DOCUMENTS

| | | | |
|---|---|---|---|
| 4,197,024 | 3/1980 | Huntoon | 400/636 |
| 4,279,525 | 7/1981 | Johnston | 400/656 |
| 4,465,390 | 8/1984 | Zander | 400/689 |
| 4,480,333 | 10/1984 | Ross | 381/71 |
| 4,589,133 | 5/1986 | Swinbanks | 381/71 |
| 4,620,810 | 11/1986 | Hanyu et al. | 400/689 |
| 4,636,101 | 1/1987 | Matsukura et al. | 400/690 |
| 4,644,581 | 2/1987 | Sapiejewski | 381/74 |
| 4,654,871 | 3/1987 | Chaplin et al. | 381/72 |
| 4,677,676 | 6/1987 | Eriksson | 381/71 |
| 4,677,677 | 6/1987 | Eriksson | 381/71 |

OTHER PUBLICATIONS

IBM Technical Disclosure Bulletin, vol. 31, No. 8, Jan. 1989.

*Primary Examiner*—Edgar S. Burr

*Assistant Examiner*—Christopher A. Bennett

[57] ABSTRACT

An improved impact printer print head is provided that includes the means for active attenuation of acoustic emission in the vicinity of the print head in a printer. The print head incorporates an acoustic speaker in its assembly and/or construction. The print head also may incorporate a microphone as part of its assembly and/or construction. This improved print head when used with appropriate electronic processing can effectively attenuate the noise generated in the vicinity of the print head. In one embodiment, acoustic energy sensed by the microphone will then pass through processing electronics and be reproduced as a canceling signal by the speaker. Because of the high frequency content of the print head's acoustic output, the close proximity of the speaker to the noise producing components of the print head permits active sound attenuation technology to be applied to high frequency noise with approximately 2" or shorter wavelengths.

5 Claims, 5 Drawing Sheets

IMPACT PRINTER PRINT HEAD WITH ACTIVE SOUND PRESSURE ATTENUATION MEANS

This invention relates to the field of controlling noise from impact type printers such as dot matrix and daisy wheel printers. An impact printer imparts colored material onto paper or similar material by striking a film or ribbon containing pigment with some apparatus for the purpose of printing alpha-numeric characters or graphics. It also relates to the field of active sound control. The invention is a novel means to attenuate impact printer noise by applying active noise control technology in a novel manner.

BACKGROUND OF THE INVENTION

Previous attempts to control impact printer noise have been limited to mechanical and not electronic means. The following is a list of United States patents covering the control of printer noise through purely mechanical means such as sound absorbing materials and sound barrier constructions:

U.S. Pat. No. Des. 276,578 ACOUSTICAL ENCLOSURE FOR A PRINTER

U.S. Pat. No. Des. 261,153 ACOUSTICAL HOOD ASSEMBLY FOR A PRINTER APPARATUS

U.S. Pat. No. 4,636,101 LOW-NOISE TYPE IMPACT PRINTER

U.S. Pat. No. 4,620,810 SOUND PROOF DEVICE OF A PRINTER

U.S. Pat. No. 4,279,525 CALCULATOR PRINTER HAVING AN ACOUSTIC NOISE SUPPRESSOR

U.S. Pat. No. 4,197,024 ACOUSTICAL DAMPING FOR PRINTER

U.S. Pat. No. 4,465,390 PRINTER COMPRISING A NOISE-SEALING PAPER-TRANSPORT ROLLER

The above mentioned patents, however, generally reduce access to the printer operation causing inconvenience to the user or involve moving parts that are subject to wear and failure. The active noise control process of this invention overcomes these problems and achieves a higher theoretical noise reduction than can be obtained by mechanical means.

SUMMARY OF THE INVENTION

The present invention is a method and apparatus for the attenuation of impact type printer noise by applying the principle and techniques of active noise control in a novel and unique manner. The prior art contains no application of active noise control to impact printers. The problem with applying active noise control techniques to printers has to do with the frequency content of the noise. Typically, significant noise levels from printers are found up to 5000 Hz. Historically though, active noise control is usually only effective at low frequencies up to approximately 500 Hz. The limiting factor is the acoustical wavelength. The speaker used for sound cancellation should be less than ¼ wavelength from the sound source to be effective. Since printers generate most of their total sound power in the region of the print head; the obvious technique of incorporating a speaker into the printer chassis will not be effective. The novel feature of the present invention is an improved print head with the speaker and/or microphone attached to and moving with the print head. Thus, the microphone and speaker will always be in very close proximity to the print head. The method of attachment, as shown in FIG. 1, is only one of many possible configurations. The specifics of the simple approach of fastening, such as by gluing, or the like, the speaker and microphone components to a print head as shown on FIG. 1, is intended to be only one example of attachment or construction since other means of attachment can be employed.

It should also be noted that the present invention is not necessarily concerned with the processing electronics. The prior art is extensive in the area of signal processing electronics for active noise control but it is not believed to be disclosed in the prior art for use in conjunction with electronic sound cancellation in proximity with a print head. It is assumed that the processing hardware would contain at least some of the following functions; preamplification, signal delay, phase reversal, feedback control, signal equalization, amplification, etc. Any number of specific algorithms and techniques could be employed in the required signal processing. Examples of these techniques are described in various patents such as the following United States Patents:

U.S. Pat. No. 4,677,676 ACTIVE ATTENUATION SYSTEM WITH ON-LINE MODELING OF SPEAKER ERROR PATH AND FEEDBACK PATH

U.S. Pat. No. 4,480,333 METHOD AND APPARATUS FOR ACTIVE SOUND CONTROL

U.S. Pat. No. 4,677,677 ACTIVE SOUND ATTENUATION SYSTEM WITH ON-LINE ADAPTIVE FEEDBACK CANCELLATION

U.S. Pat. No. 4,589,133 ATTENUATION OF SOUND WAVES

U.S. Pat. No. 4,644,581 HEADPHONE WITH SOUND PRESSURE SENSING MEANS

U.S. Pat. No. 4,654,871 METHOD AND APPARATUS FOR REDUCING REPETITIVE NOISE ENTERING THE EAR

BRIEF DESCRIPTION OF THE DRAWINGS

The invention will be further described and explained with reference to the accompanying drawings, in which:

In FIG. 5, a tube has been added to conduct sound from the speaker to the vicinity of the print head.

DESCRIPTION OF THE PREFERRED EMBODIMENT

The following describes a demonstration system suitable for verification of the effectiveness of the approach of the current invention of mounting a speaker and microphone on the print head. In a production version, the electronic components could be reduced to one special purpose processing unit at a much lower cost.

Figure 1:
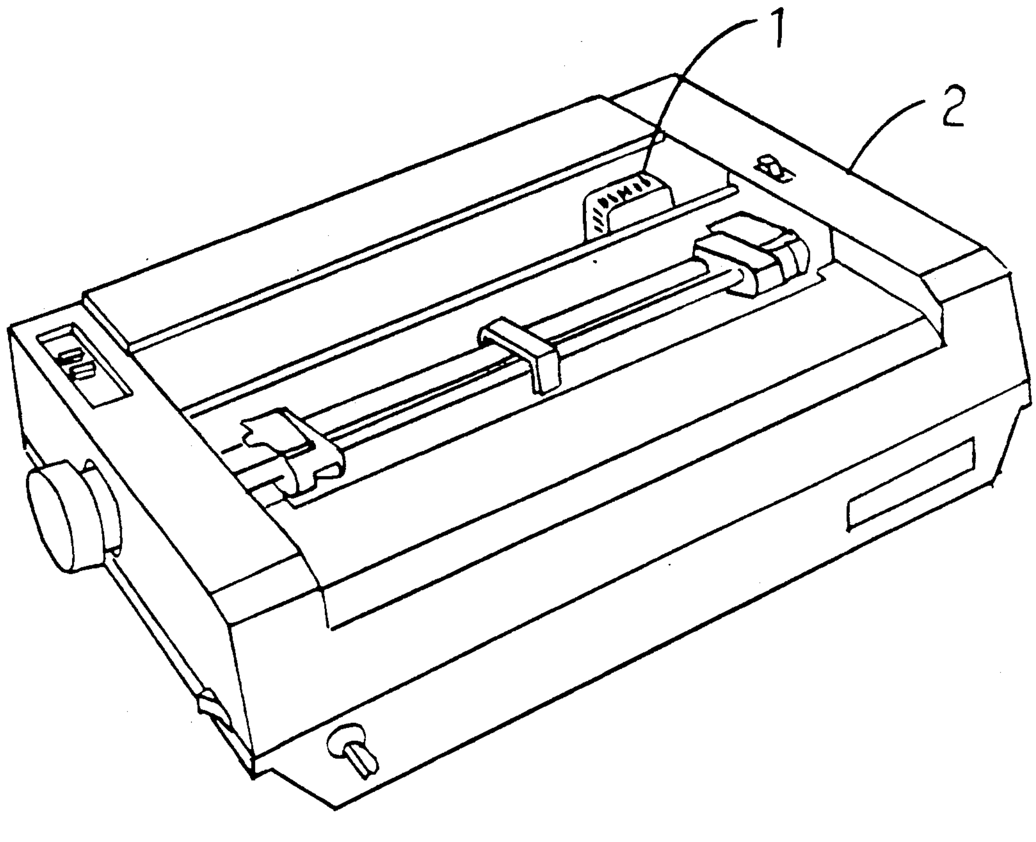
FIG. 1 shows a state of the art printer, a Panasonic Model KX-1080i 9-pin dot matrix printer.

Referring to FIG. 1 there is shown the state of the art printer used; a Panasonic Model KX-1080i 9-pin dot matrix printer 2.

Figure 2:
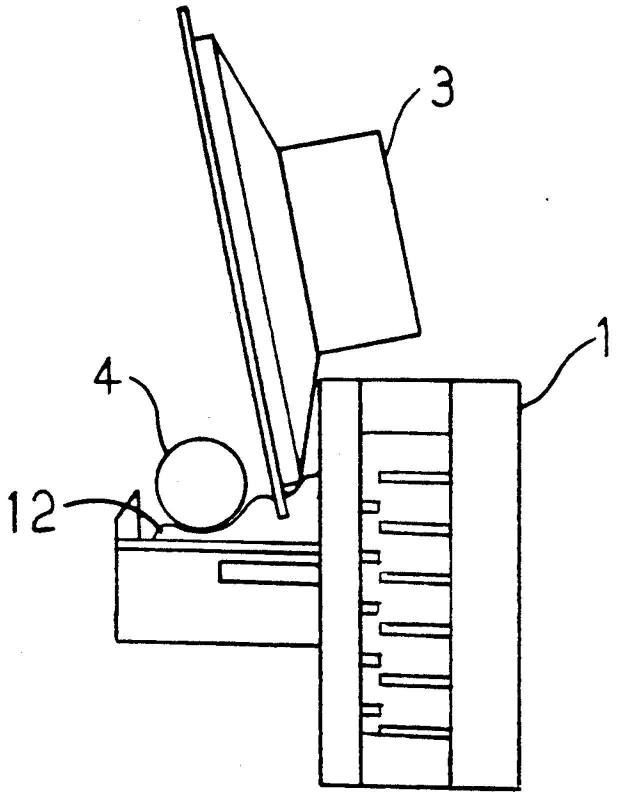
FIG. 2, is a view of the Panasonic Model KX-1080i's print head with attached speaker and microphone.

In FIG. 2, a side view of the Panasonic Model KX-P 1080i print head 1 is shown. Attached to the print head by means of glue or other fastening 12 is a 1" in diameter paper cone acoustic speaker 3. Also attached to the print head by means of fastening 12 is a Beyer Dynamic Model MCE microphone 5.

Figure 3:
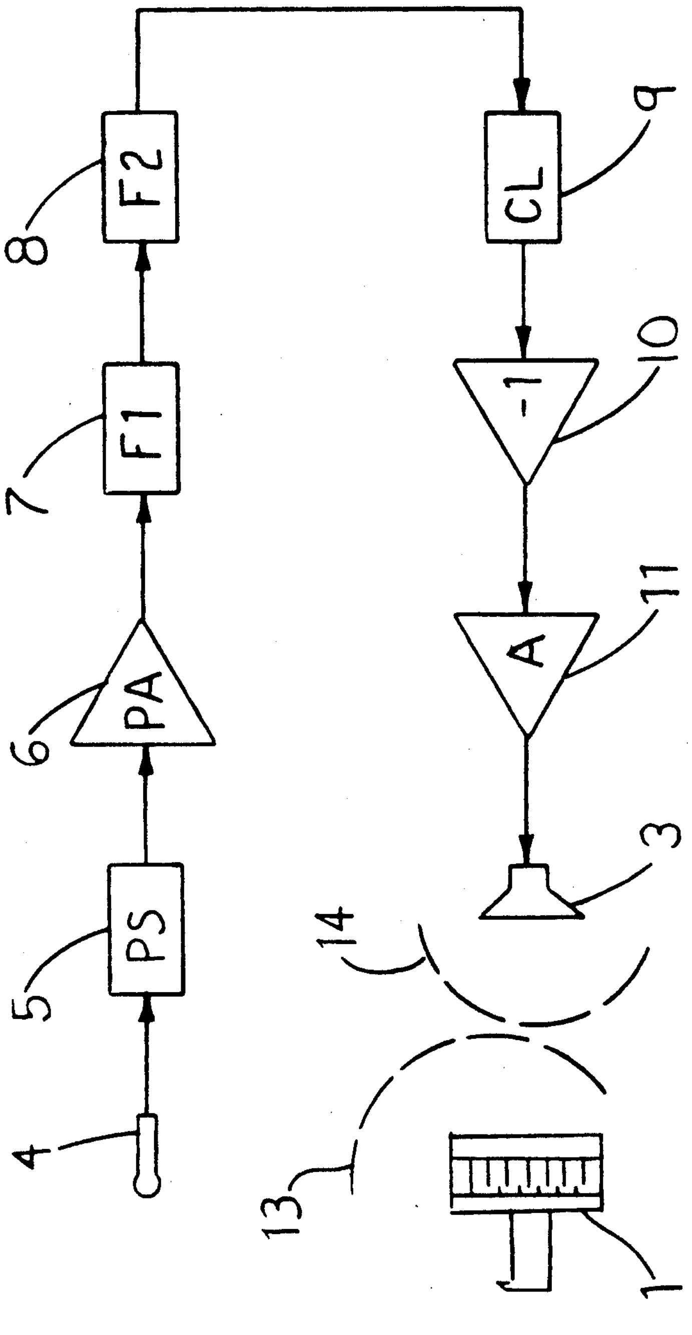
FIG. 3 shows the electronic clock diagram of the system.

FIG. 3 shows the electronic block diagram of the system comprising the following specific components;

Loudspeaker 3 is a 1" in diameter, closed back, dynamic loudspeaker.

Microphone 4 is a Beyer Dynamic Model MCE 5 miniature electret-condenser microphone.

Microphone power supply 5 is a Beyer Dynamic Model MSB 18 power supply represented in FIG. 3 by "PS".

Preamplifier 6 is a Shure Model FP 11 represented in FIG. 3 by "PA".

Filter 7 is a Yamaha Model DEQ 7 represented in FIG. 3 by "F1".

Filter 8 is a Yamaha Model DEQ 7 represented in FIG. 3 by "F2".

Compressor/limiter 9 is a dbx Model 165A represented in FIG. 3 by "CL".

Phase invertor 10 represented in FIG. 3 by "−1".

Amplifier 11 represented in FIG. 3 by "A".

Now the block diagram of the demonstration system as shown in FIG. 1, FIg. 2, and FIG. 3 will be described in more detail.

The microphone 4 translates the acoustic emission 13 in the vicinity of the print head 1 into an electrical signal. Power to the microphone is provided by power supply 5. This signal is preamplified by the preamplifier 6 to raise the signal voltage to a level compatible with the other signal processing electronics.

The preamplified microphone signal's frequency content is then filtered using the $\frac{1}{3}$ octave bandwidth, 27 band filters 7 and 8. The filters high-pass the signal at 400 Hz and low-pass the signal at 5000 Hz. This limits the bandwidth of the signal to between 400 Hz and 5000 Hz. The exact frequencies used should be field adjusted for maximum acoustical attenuation of the printer noise without feedback. The 400 Hz cutoff prevents damage to the speaker due to excessive speaker cone excursion at low frequency. The 5000 Hz cutoff prevents feedback. This high-pass frequency is a function of the speaker to microphone distance.

Additional filtering using filters 7 and 8 is also required. Each of the 27 filter bands should be adjusted while the sound attenuation system is on and the printer is printing for maximum attenuation without feedback. The adjustment process is largely trail and error and the final filter settings will depend on the other components of the system especially the speaker, microphone and printer.

Next, the signal will pass through compressor/limiter 9. The compressor is used to suppress feedback.

The compressor's compression threshold should be adjusted to be slightly higher than the average microphone signal level with the sound attenuation system on and printer printing.

After the compressor, the signal passes through signal delay 10. The signal delay compensates for phase shift occurring in filters 7, and 8, Again, the signal delay time will be field adjusted and is dependant on the microphone to print head pin proximity.

Next, the signal passes through the phase invertor 10 to shift the signal phase 180 degrees.

The signal is then amplified using amplifier 11. The amplifier gain is adjusted for maximum attenuation of the printer noise without feedback.

Finally, the amplifier output drives loudspeaker 3 whose acoustic output 14 cancels the acoustic emission 13 generated by print head 1.

Figure 4:
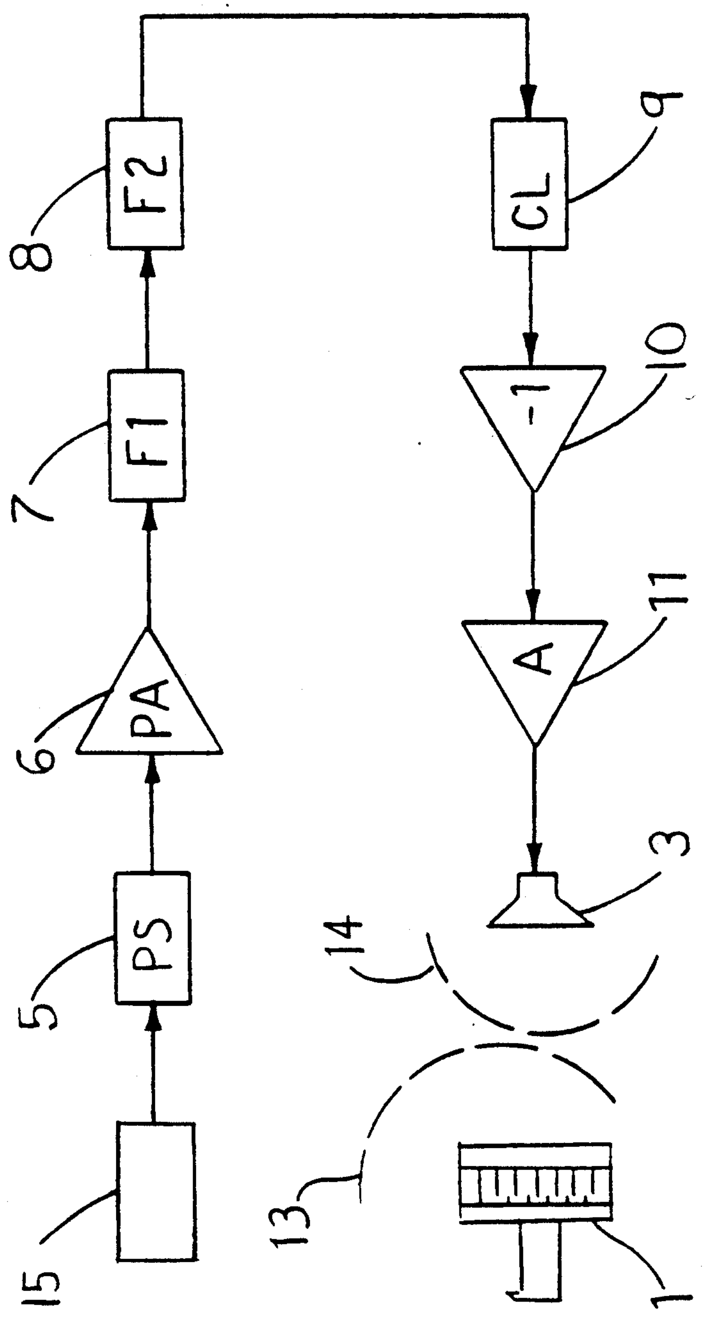
FIG. 4 is a variation of FIG. 3 showing the electronic block diagram of the system with the microphone replaced by a waveform generator.

One variation on the system is to omit the microphone 4. This variation is shown on FIG. 4. Instead a waveform generator 15 could provide the cancellation signal source in a similar manner to the method described in U.S. Pat. No. 4,654,871. The waveform generator would be under external control for synchronization as in U.S. Pat. No. 4,654,871. The waveform generator 15 could further have a plurality of samples representing noise generated by the print head for the various characters the printer is capable of printing.

Figure 5:
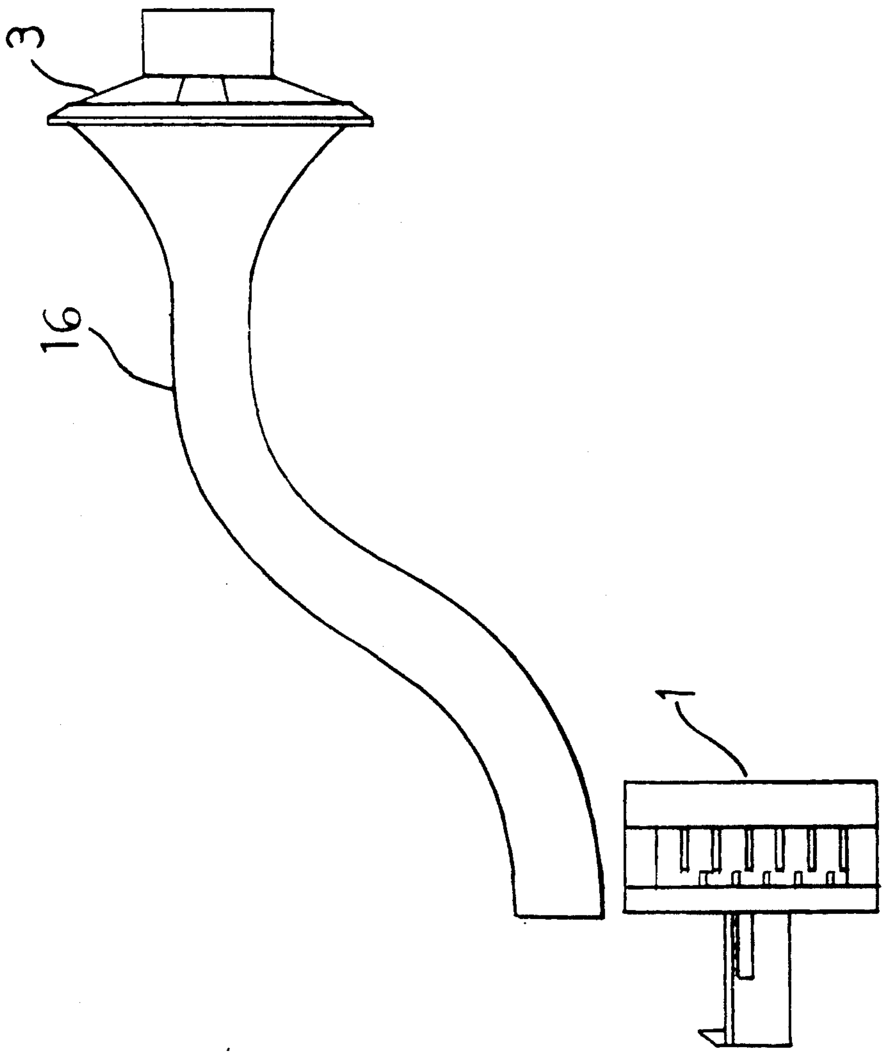
FIG. 5 is similar to FIG. 2.

FIG. 5 shows a further variation of the system, in which the acoustic output of the speaker 3, is channeled through tube 16. The tube could be a hollow flexible plastic or similar material. The end of the tube not attached to the speaker would be attached in the vicinity of the print head.

There has been described herein a novel apparatus and techniques for applying active sound control to printers. It is evident that those skilled in the art upon reviewing this disclosure may make changes to and modifications of the specific embodiments described herein, without departing from the inventive concepts disclosed. Consequently, the invention, as claimed, is to be construed to be embracing each and every variation or modification that may be considered by others.

The description of the preferred embodiment herein is set forth for illustrative purposes only.

What is claimed is:

1. An active noise attenuation system for an impact type printer of the type that generates noise, comprising, a printer means, said printer means having a print head therein which is capable of lateral shift to deliver print material onto a sheet, at least one microphone attached to said head and capable of simultaneous lateral shift therewith to receive the generated noise of printing, at least one speaker attaching to said head and capable of simultaneous lateral shift herewith, electronic means operatively associated with said microphone to receive the noise absorbed by the said microphone, said microphone capable of converting the generated noise to an electronic signal, said electronic means receiving the said converted electronic signal representative of noise from the microphone and means for processing said signal for affecting a shift in it's phase and conducting said processed signal to said speaker for producing a sound in proximity of said printer head for reducing the print head audible generated sound.

2. An apparatus for attenuating noise from an impact type printer of the type that generates noise comprising a printer means, said printer means having a print head therein and which is capable of lateral shift to deliver print material onto a sheet, at least one microphone attached in proximity to said head and capable of simultaneous lateral shift therewith to receive the generated noise of printing, said microphone capable of converting the generated noise to an electronic signal, at least one speaker also attached in proximity to said head and capable of simultaneous lateral shift herewith, electronic means operatively associated with said microphone to receive the noise absorbed by the said microphone, said electronic means receiving the said converted electronic signal representative of noise from the microphone and means for processing said signal to generate a canceling waveform and conducting said canceling waveform to said speaker for producing a canceling noise in proximity of said printer head for reducing the print head audible generated sound.

3. A method for reducing the noise generated by a print head the method comprising providing a microphone for receiving noise generated by the print head in the vicinity of the print head by means of said microphone, modifying the output of the microphone to generate a cancellation signal, and transmitting said cancellation signal by means of a speaker located in the proximity of said print head.

4. An apparatus for attenuating noise from an impact type printer of the type that generates noise comprising a printer means, said printer means having a print head therein and which is capable of lateral shift to deliver print material onto a sheet, a signal generator capable of approximating the generated noise of printing, said signal generator capable of converting the approximated generated noise of printing to an electronic signal, at least one speaker attached in proximity to said head and capable of simultaneous lateral shift herewith, electronic means operatively associated with said signal generator to receive the electronic signal from the said signal generator, said electronic means receiving the said electronic signal approximating the generated noise of printing and means for processing said electronic signal to generate a canceling waveform and conducting said canceling waveform to said speaker for producing a canceling noise in proximity of said printer head for reducing the print head audible generated sound.

5. An apparatus for attenuating noise from an impact type printer of the type that generates noise comprising a printer means, said printer means having a print head therein and which is capable of lateral shift to deliver print material onto a sheet, a signal generator capable of approximating the generated noise of printing, said signal generator capable of converting the approximated generated noise of printing to an electronic signal, at least one speaker, a tube attached to said speaker at one end and the other end of tube attached in proximity to said head and capable of simultaneous lateral shift herewith, electronic means operatively associated with said signal generator to receive the electronic signal from the said signal generator, said electronic means receiving the said electronic signal approximating the generated noise of printing and means for processing said electronic signal to generate a canceling waveform and conducting said canceling waveform to said speaker for producing a canceling noise, said canceling noise conducted through said tube and emitting said canceling noise in proximity of said printer head for reducing the print head audible generated sound.

* * * * *